United States Patent [19]  [11] Patent Number: 4,996,520
Williams et al.  [45] Date of Patent: Feb. 26, 1991

[54] OVERVOLTAGE DETECTION TEST APPARATUS FOR MILITARY AIRCRAFT WEAPONS SYSTEMS

[75] Inventors: Robert A. Williams; Stephen Tye, both of Fort Worth, Tex.

[73] Assignee: Williams Instruments, Inc., Fort Worth, Tex.

[21] Appl. No.: 208,732

[22] Filed: Jun. 17, 1988

[51] Int. Cl.⁵ .............................................. G08B 21/00
[52] U.S. Cl. ..................................... 340/662; 361/91; 340/661
[58] Field of Search .............. 340/660, 661, 662, 657; 324/503, 133; 361/90, 91, 92, 79

[56] References Cited

U.S. PATENT DOCUMENTS 3,727,399 12/1975 Fuzzell ............................ 340/662 X
3,999,015 12/1976 Snyder et al. .................... 340/662 X Primary Examiner—Joseph A. Orsino
Assistant Examiner—Jeffery A. Hofsass
Attorney, Agent, or Firm—Arthur F. Zobal

[57] ABSTRACT

The test apparatus of the present invention tests the power supply on a military aircraft, which power supply provides power to missiles carried by the aircraft. The apparatus tests for an overvoltage condition, wherein the power supply output exceeds the maximum allowable voltage of the missiles. The test apparatus includes an electrical connector for interfacing the test apparatus with the aircraft power supply, and an electrical comparator that compares the voltages from first and second inputs. The first input is clamped to a voltage which is representative of the maximum voltage limit of the missiles and the second input is tied to the output of the aircraft power supply so as to vary with the power supply output. The comparator activates a warning lamp when the second input voltage exceeds the first input voltage to warn an operator of an overvoltage condition.

6 Claims, 2 Drawing Sheets

OVERVOLTAGE DETECTION TEST APPARATUS FOR MILITARY AIRCRAFT WEAPONS SYSTEMS

FIELD OF THE INVENTION

The present invention relates to overvoltage detection test apparatuses for use in testing military aircraft while on the ground, and in particular for use in testing onboard power supplies that provide power to weapons.

BACKGROUND OF THE INVENTION

The F-16 fighter aircraft has a power supply that supplies power to missiles mounted on the airframe. The aircraft power supply is designed to produce 175 volts dc. Although the power supply is regulated, it is not overvoltage protected. The aircraft power supply is in an overvoltage condition when its output voltage exceeds 185 volts dc. If a missile was mounted to the aircraft during an overvoltage condition of the power supply, then the missile could be damaged to the point of either malfunction or failure. A recent survey by a defense contractor found that out of 70 aircraft power supplies, 12 power supplies exceeded the maximum voltage limit of the missiles; a 17% overvoltage rate. Therefore, what is needed is a test apparatus that can detect an overvoltage condition of the aircraft power supply.

SUMMARY OF THE INVENTION

The object of the present invention is to provide a test apparatus that will detect when a military aircraft power supply is in an overvoltage condition, said aircraft power supply providing power to the missiles.

The test apparatus of the present invention includes electrical connector means for interfacing with the aircraft power supply before the missiles are loaded onto the aircraft and while the aircraft is on the ground. The test apparatus also includes electrical comparator means for comparing inputs. The comparator means includes first and second inputs and an output. The first input is tied to the maximum voltage limit of the missiles so as to be unvarying therefrom and the second input is tied to the output of the aircraft power supply so as to vary with the power supply. The output is connected to warning means, which in one aspect of the invention is a lamp. The comparator means activates the warning means whenever the second input voltage exceeds the first input voltage to indicate an overvoltage condition of the aircraft power supply.

In one aspect of the present invention, self-test switch means is provided to test the operation of the comparator means and the warning means.

The test apparatus of the present invention permits testing of an aircraft power supply in conjunction with preexisting and conventional ground test apparatus without major modification to the preexisting test apparatus.

DESCRIPTION OF THE PREFERRED EMBODIMENT

Figure 1:
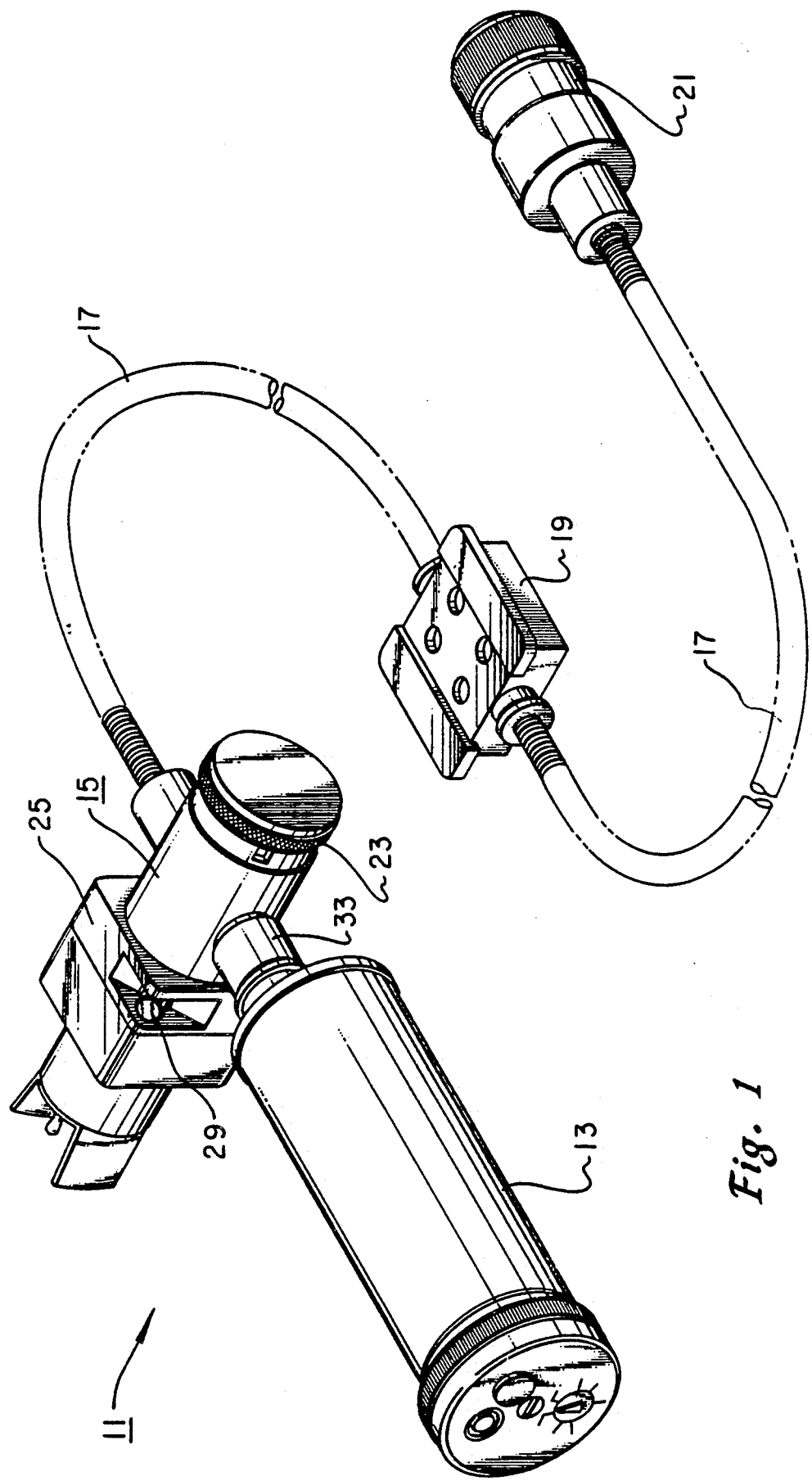
FIG. 1 is a schematic isometric view showing the test apparatus of the present invention, in accordance with a preferred embodiment.

In FIG. 1, there is shown an isometric view of the test apparatus 11 of the present invention, in accordance with a preferred embodiment. The test apparatus is used primarily for testing that portion of the electrical system of a military aircraft (in particular an F-16 fighter aircraft) that services missiles carried by the aircraft. The test apparatus of the present invention includes an overvoltage detection portion which checks for an overvoltage condition cf the onboard power supply that provides power to the missiles. The missiles that are carried by the aircraft have a maximum voltage limit of 185 volts dc. Any voltage supplied to the missiles that exceeds 185 volts dc is referred to herein as an overvoltage, and the power supply is said to be in overvoltage condition. The test apparatus is used while the aircraft is on the ground and before missiles are loaded onto the aircraft. The test apparatus 11 includes a voltage detector unit 13, a switch unit 15, a test cable 17, a rail connector 19, and an umbilical connector 21.

The voltage detector unit 13 contains voltage detection apparatus for use in testing the various aspects of that portion of the aircraft's electrical system that services missiles. The voltage detector unit 13, which is conventional, does not detect overvoltages.

Figure 2:
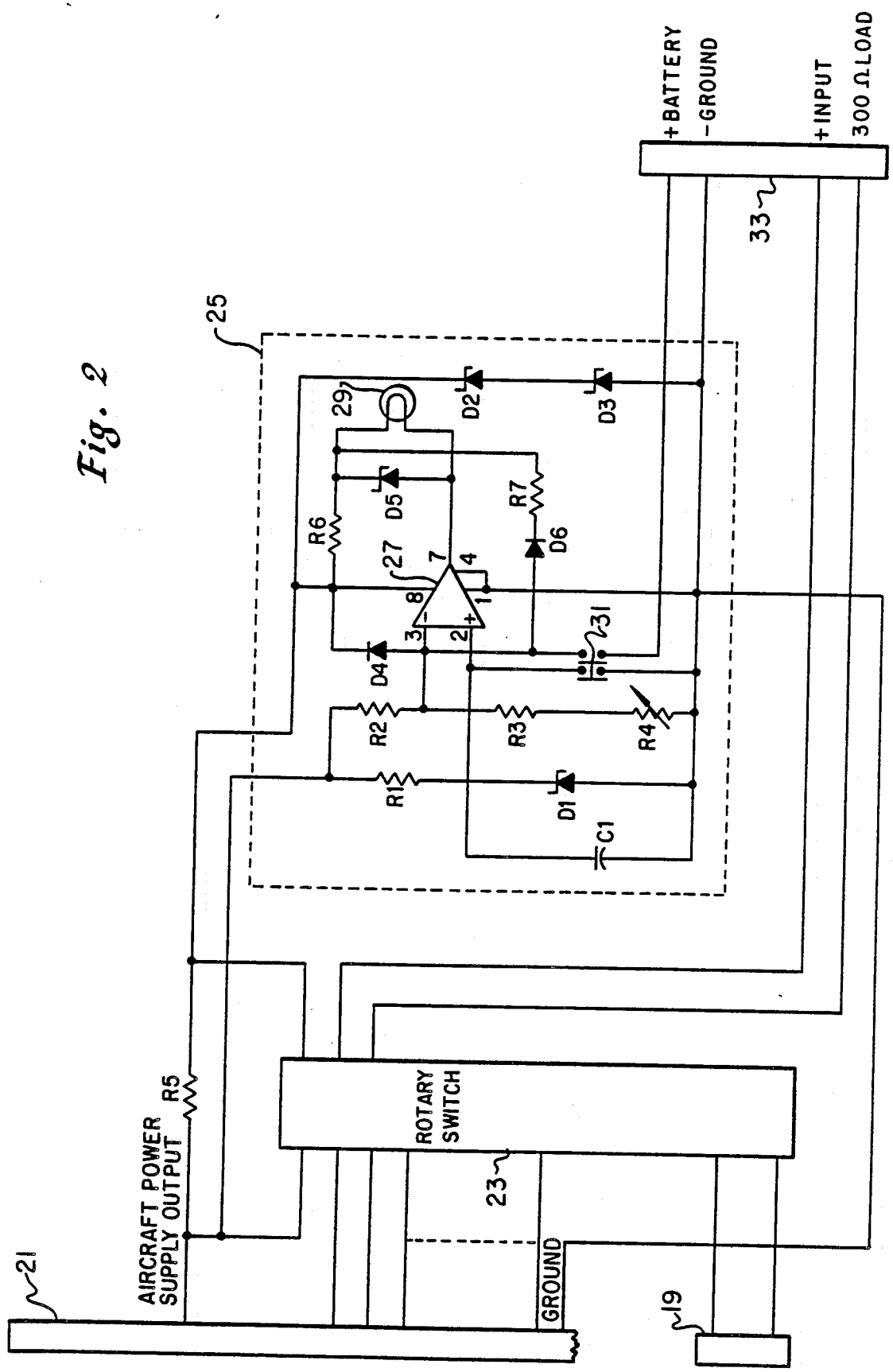
FIG. 2 is an electrical schematic diagram of the overvoltage detection test apparatus of the present invention, in accordance with a preferred embodiment.

The switch unit 15 includes a multiposition rotary switch 23 and the overvoltage detection unit 25. The electrical schematic diagram of the switch unit is shown in FIG. 2. In FIG. 2, the test cable 17 per se is not shown, instead the conductors going from the components inside the switch unit 15 to the rail connector 19 and the conductors going from the switch unit components to the umbilical connector are shown. The conductors from the switch unit 15 to the rail connector 19 and from the switch unit to the umbilical connector 21 are contained within the test cable 17. The rotary switch 23 is used to select specific conductors in the test cable 17 for connection to the voltage detector unit 13. The switch unit 15 is connected to the voltage detector unit 13 through a connector 33.

The electrical circuit of the overvoltage detection unit 25 includes a comparator 27 and a warning lamp 29. The comparator 27 is a commercially available LM 111 integrated circuit The noninverting input (pin 2) of the comparator 27 is connected in series with resistor R1 to the output of the aircraft power supply that services the missiles carried by the aircraft. The noninverting input is connected to the power supply through the umbilical connector 21. Resistor R1, which is 680 Kohms, and zener diode D1, which is connected to ground, clamp the noninverting input of the comparator to 6.2 volts thereby making the voltage at the noninverting input unvarying. This voltage is stabilized by capacitor C1. The inverting input (pin 3) of the comparator 27 is also connected to the output of the aircraft power supply through the umbilical connector 21, although the inverting input is in series with resistor R2. Resistors R2 and R3, and potentiometer R4, which are 680 Kohms, 20 Kohms, and 10 Kohms, respectively, divide the aircraft power supply voltage down to a smaller voltage for the inverting input. Potentiometer R4 is adjusted during assembly of the overvoltage detection unit 25 to provide 6.2 volts to the inverting input when 185 volts dc is applied across the resistors R2 and R3, and potentiometer R4. Thus, the voltage at the inverting input of the comparator varies proportionately to the output voltage of the aircraft power supply. The aircraft power supply provides power to the comparator 27 as follows: pin 8 of the comparator is connected in series with resistor R5, and through the umbilical connector 21, to the output of the power supply. Zener diodes D2 and D3 clamp the supply voltage going to pin 8 of the comparator at a maximum voltage of 20 volts. Pins 1 and 4 of the comparator are grounded. Diode D4, which is connected from pin 3 to pin 8, protects the inverting input of the comparator from too much voltage. The output (pin 7) of the comparator 27, which is connected in series with the lamp 29 and resistor R6, is also connected to the comparator power supply. Zener diode D5 clamps the voltage across the lamp to 6.2 volts.

In operation, the test apparatus 11 is connected to the aircraft by connecting the rail connector 19 to the respective aircraft rail that receives the respective missile and by connecting the umbilical connector 21 to the respective umbilical cable connector on the aircraft. The overvoltage detection circuit operates independently of the rotary switch 23. When the output voltage of the aircraft power supply exceeds 185 volts, which voltage is the maximum voltage limit allowable by the missiles, the voltage at the inverting input (pin 3) exceeds the clamped voltage at the noninverting input (pin 2) causing the output (pin 7) of the comparator to go low. This provides a ground for the lamp and the lamp thereby illuminates to indicate to an operator an overvoltage condition. If an overvoltage condition of the power supply is detected, loading of the missiles onto the aircraft is postponed until the overvoltage condition is corrected.

The overvoltage detection circuit has a self-test capability, to check the operation of the comparator 27 and the lamp. The self-test operation can be performed without connecting the test apparatus 11 to the aircraft power supply. The noninverting and inverting inputs (pins 2 and 3) of the comparator are connected respectively to the positive terminal of a battery contained within the voltage detector unit 13 and to ground through a switch 31 and through a connector 33. The lamp, which is connected in series with a resistor R7 and a diode D6, is connected to the battery through the switch 31. Supply voltage is provided to pin 8 of the comparator through diode D4, which is connected to the voltage detector battery through pin 3. When the switch 31 is closed, the inverting input of the comparator is at the battery voltage and the noninverting input is at ground, thus causing the output of the comparator to go low and lighting the lamp.

The foregoing disclosure and the showing made in the drawings are merely illustrative of the principles of this invention and are not to be interpreted in a limiting sense.

We claim:

1. A test apparatus for detecting overvoltage conditions in a power supply that is contained within a military aircraft, said power supply has an output that provides power to missiles mounted on said aircraft, said missiles having a maximum voltage limit, comprising:
   (a) electrical connector means for interfacing the test apparatus with said aircraft power supply while said aircraft is on the ground and before said missiles have been loaded onto said aircraft,
   (b) electrical comparator means for comparing inputs comprising first and second inputs and an output, said first input being clamped to a voltage which is representative of said maximum voltage limit, said second input being tied to said aircraft power supply output so as to vary with said power supply output such that said second input voltage exceeds said first input voltage when said power supply output exceeds said maximum voltage limit, said comparator means output connected to warning means, said warning means being activated by said comparator means when said second input voltage exceeds said first input voltage, wherein an overvoltage condition of said aircraft power supply is indicated,
   (c) self-test switch means, said self-test switch means when activated connecting said second input to a larger voltage than is connected to said first input, wherein the operation of said comparator means and said warning means can be tested,
   (d) test power supply means separate from said aircraft power supply, said test power supply means being connected with said first and second inputs through said self-test switch means.

2. The apparatus of claim 1 wherein said test power supply means comprises a battery.

3. The apparatus of claim 2, further comprising:
   (a) rail connector means adapted to connect to an aircraft missile rail;
   (b) switch means comprising a multiposition switch for selecting various electrical circuits on board said aircraft;
   (c) said rail connector means being electrically connected with said switch means;
   (d) said electrical comparator means being connected to said switch means.

4. A test apparatus for detecting overvoltage conditions in a power supply that is contained within a military aircraft, said power supply has an output that provides power to missiles mounted on said aircraft, said missiles having a maximum voltage limit, comprising:
   (a) electrical connector means for interfacing the test apparatus with said aircraft power supply while said aircraft is on the ground and before said missiles have been loaded onto said aircraft,
   (b) electrical comparator means for comparing inputs comprising first and second inputs and an output, said first input being clamped to a voltage which is representative of said maximum voltage limit, said second input being tied to said aircraft power supply output so as to vary with said power supply output such that said second input voltage exceeds said first input voltage when said power supply output exceeds said maximum voltage limit, said comparator means output connected to warning means, said warning means being activated by said comparator means when said second input voltage exceeds said first input voltage, wherein an overvoltage condition of said aircraft power supply is indicated,
   (c) self-test switch means, said self-test switch means when activated connecting said second input to a larger voltage than is connected to said first input, wherein the operation of said comparator means and said warning means can be tested,
   (d) said warning means comprises a light, wherein said light illuminates to indicate an overvoltage condition in said power supply,
   (e) test power supply means separate from said aircraft power supply, said test power supply means being connected with said first and second inputs through said self-test switch means.

5. A method for detecting overvoltage conditions in a power supply that is contained within an aircraft, comprising the steps of:

(a) providing electrical comparator means having first and second inputs for comparing two voltages, said comparator means having an output connected to warning means, said warning means being activated by said comparator means when the voltage at said second input exceeds the voltage at said second input;

(b) providing test power supply means separate from said aircraft power supply;

(c) applying said test power supply means to said comparator means such that the voltage applied to said second input exceeds the voltage applied to said first input;

(d) monitoring said warning means for a period of time to determine the operability of said warning means and said comparator means;

(e) removing said test power supply means from said comparator means;

(f) while said aircraft is on the ground, connecting said comparator means to said aircraft power supply such that the output of said aircraft power supply is connected to said second voltage input of said comparator means with the voltage at said first input being fixed to a preselected level;

(g) monitoring said warning means for a period of time to determine the presence or absence of an overvoltage condition;

(h) disconnecting said comparator means from said aircraft power supply.

6. The method of claim 5, wherein said test power supply means is applied to said comparator means before connecting said comparator means to said aircraft power supply.

* * * * *